United States Patent [19]

Cillessen et al.

[11] Patent Number: 5,744,864
[45] Date of Patent: Apr. 28, 1998

[54] SEMICONDUCTOR DEVICE HAVING A TRANSPARENT SWITCHING ELEMENT

[75] Inventors: Johannes F. M. Cillessen; Paulus W. M. Blom, both of Eindhoven, Netherlands; Ronald M. Wolf, Katonah, N.Y.; Jacobus B. Giesbers, Eindhoven, Netherlands

[73] Assignee: U.S. Philips Corporation, New York, N.Y.

[21] Appl. No.: 692,295

[22] Filed: Aug. 1, 1996

[30] Foreign Application Priority Data

Aug. 3, 1995 [EP] European Pat. Off. .............. 95202117

[51] Int. Cl.$^6$ .......................... H01L 29/04; H01L 29/76; H01L 23/48
[52] U.S. Cl. ................. 257/749; 257/59; 257/66; 257/72
[58] Field of Search ................. 257/59, 66, 749, 257/72

[56] References Cited

U.S. PATENT DOCUMENTS

| | | | |
|---|---|---|---|
| 4,733,284 | 3/1988 | Aoki et al. | 257/749 |
| 4,900,370 | 2/1990 | Itoga et al. | 136/256 |
| 5,229,644 | 7/1993 | Wakai et al. | 257/749 |
| 5,397,920 | 3/1995 | Tran | 257/749 |
| 5,619,044 | 4/1997 | Makita et al. | 257/64 |

FOREIGN PATENT DOCUMENTS 60-198861A 10/1985 Japan.

*Primary Examiner*—Valencia Martin Wallace
*Attorney, Agent, or Firm*—Steven R. Biren

[57] ABSTRACT

A semiconductor device includes a transparent switching element (1) with two connection electrodes (2, 3) of a transparent material and an interposed transparent channel region (4) of a semiconductor material provided with a transparent gate electrode (5) of a conductive material, separated from the channel region (4) by a transparent insulating layer (6). The semiconductor material is a degenerate semiconductor material with a basic material having a bandgap (10) between conduction band (11) and valence band (12) of electrons greater than 2.5 eV and a mobility of charge carriers greater than 10 cm$^2$/Vs provided with dopant atoms which form a fixed impurity energy level (13) adjacent or in the valence band (12) or conduction band (11) of the basic material. The degenerate semiconductor material is transparent because the absorption of visible light is not possible owing to the great bandgap (10), while also no absorption of visible light takes place through the impurity energy levels (13). The device is capable of comparatively fast switching.

10 Claims, 6 Drawing Sheets

SEMICONDUCTOR DEVICE HAVING A TRANSPARENT SWITCHING ELEMENT

BACKGROUND OF THE INVENTION

The invention relates to a semiconductor device with a transparent switching element with two connection electrodes of transparent material and an interposed transparent channel region of a semiconductor material provided with a transparent gate electrode of conductive material separated from the channel region by a transparent insulating layer. The term "transparent" is understood to mean here that light is (practically) not absorbed in the visible range.

Japanese Patent Application 60-198861 discloses a device of the kind mentioned in the opening paragraph in which the transparent connection electrodes and the gate electrode are made of tin-doped indium oxide and the insulating layer of silicon oxide. $WO_3$ is used as the transparent semiconductor material of the channel region.

The known semiconductor device is a so-called "electrochromic device" (ECD). An electrolyte is present above a connection electrode in such a device. $H^+$ ions diffuse from this electrolyte into the $WO_3$. The $WO_3$ is capable then of absorbing visible light, i.e. the switching element assumes a color. The diffusion of $H^+$ ions proceeds comparatively slowly. The switching element has a certain memory effect owing to this slowness of the $H^+$ ions, i.e. the switching element retains a given state for a certain time. The known semiconductor device is transparent to a very limited degree only, i.e. only when there are no $H^+$ ions in the $WO_3$. The conductivity of the $WO_3$, which is an insulator in itself, is determined by a reduction in the quantity of oxygen in the $WO_3$ ("oxygen depleted $WO_3$").

The known device described above is found to have the disadvantage in practice that the device switches comparatively slowly because switching of the switching element is partly also determined by the solid state diffusion of $H^+$ ions. It is also found that the absorption of visible light increases strongly in the known semiconductor material at a comparatively small removal of oxygen, so that the material is no longer transparent when a certain desired conductivity has been achieved in the semiconductor material. This means that the known switching element cannot be used as a switching element which is transparent under all circumstances.

SUMMARY OF THE INVENTION

The invention has for its object inter alia to counteract said disadvantages.

According to the invention, the device is for this purpose characterized in that the semiconductor material comprises a degenerate semiconductor material with a basic material having a bandgap between the conduction and the valence bands of electrons greater than 2.5 eV and a mobility of charge carriers greater than 10 $cm^2/Vs$ provided with dopant atoms which form a fixed impurity energy level adjacent or in the valence or conduction band of the basic material. A basic material is then chosen with a bandgap greater than 2.5 eV and a mobility greater than 10 $cm^2/Vs$, after which the conductivity is determined through a suitable choice of the nature and concentration of dopant atoms. A concentration of dopant atoms which lies between 0.001% and 0.3% supplies a sufficient conductivity. The impurity energy levels are adjacent the valence or conduction band if they are at a distance of less than approximately 0.1 eV from the band. Electrons may be readily exchanged with the valence or conduction band from the impurity energy levels at room temperature.

Visible light has insufficient energy for making electron-hole pairs in a semiconductor material having a bandgap greater than approximately 2.5 eV, so that this visible light is not absorbed by the semiconductor material. The degenerate semiconductor material according to the invention is transparent because the absorption of visible light is not possible on account of the great bandgap, while at the same time no absorption of visible light takes place through the impurity energy levels. In addition, a switching element provided with the semiconductor material according to the invention is comparatively fast because of the high mobility of charge carriers.

Preferably, the basic material comprises a covalent oxide of a non-transition metal. Oxides of such metals and compounds of oxides of such metals, e.g. Ga, Bi, Sn, Zn, Sb, Pb, Ge, and In, have a mobility greater than 10 $cm^2/Vs$ and a bandgap greater than 2.5 eV (cf. e.g. J. Phys. Chem. Ref. Data, Vol. 2, No. 1, 1973, p. 163 ff.). The more ionic oxides of non-transition metals are not suitable as basic materials because of a strong interaction between charge carriers and ions in the crystal lattice.

Preferably, the basic material comprises a covalent oxide of a metal from the group Sn, Zn, and In. These covalent oxides have a comparatively high mobility of more than 30 $cm^2/Vs$ even when provided with dopant atoms. The dopant atoms are attuned to the covalent oxides used. Dopant atoms such as Sb, F, or Cl may thus be used when $SnO_2$ is the covalent oxide, Sn dopant atoms for $In_2O_3$, and Ga dopant atoms for ZnO as the oxide.

In a preferred embodiment, the connection electrodes, the gate electrode, and the channel region comprise the same basic material provided with dopant atoms of the same type, while the semiconductor material contains a smaller quantity of dopant atoms than does the conductive material. Such a device can be manufactured comparatively easily because the same material is used, differing only in the quantities of dopant atoms. Preferably, the conductive material contains more than 0.5% dopant atoms and the semiconductor material less than 0.3% dopant atoms. Advantageously, the basic material comprises $SnO_2$ and the dopant atoms comprise Sb.

An additional advantage is obtained when the insulating layer comprises a ferroelectric material. The ferroelectric material may be, for example, lithium niobate ($LiNbO_3$), lithium tantalate ($KTaO_3$) or lead-zirconium titanate ($PbZrTiO_3$). Preferably, lead-zirconium titanate is chosen because of the comparatively easy manufacture, the compatibility of this material with other materials, and the comparatively high polarization (approximately 50 $\mu C/cm^2$) and the low electric switching field (approximately 20 kV/cm). The switching element then has a non-volatile memory. The application of a voltage to the gate electrode, for example, for switching off the switching element through removal of charge carriers from the channel region will cause an electric field across the ferroelectric material. When this voltage is removed again, there will be a remanent polarization of the ferroelectric material, i.e. the ferroelectric material remembers the direction of the electric field. The remanent polarization ensures that the channel region remains free from charge carriers, so that the switching element remains switched off in spite of the removal of the voltage.

Preferably, the device comprises an electro-optical display element with electrodes and an electro-optical material disposed between the electrodes, a connection electrode of the transparent switching element being connected to an electrode of the display element, while the switching element and the display element overlap one another at least partly. An electro-optical display element is here understood to be a display element whose optical properties change under the influence of an electrical quantity such as current or voltage, for example an element usually referred to as a liquid crystal display (LCD). The switching element according to the invention is sufficiently fast for switching the display element at such a high frequency that the use of the switching element in a liquid crystal display is possible. The display element acts in electrical terms as a capacitor which is charged or discharged by the accompanying switching element. In practice, the semiconductor device often comprises many display elements each with its own switching element, for example arranged in a matrix. The switching elements lie next to the display elements in known devices. The device then occupies a comparatively large surface area. The surface area utilized for the switching elements is not used for electro-optical display elements. In the semiconductor device according to the invention, the switching element and the display element overlap partly or wholly, so that a much greater portion of the surface of the device can be used for display elements. The transparent switching elements do not hamper the passage of light through the display elements.

An additional advantage is obtained when the device comprises an electro-optical imaging element, the transparent switching element being connected to the imaging element, while the switching element and the imaging element overlap one another at least partly. The device then forms part of an optical recording device such as a camera or scanner. An electro-optical imaging element is here understood to be an element which converts a photon flux into a quantity which is to be measured electrically. It is thus possible, for example, to read out charge introduced into the imaging element by a photon by means of the switching element. Since the switching element is transparent, the switching element and the imaging element may overlap partly or wholly. The camera may then be designed to be very compact, while in addition each imaging element can be, for example individually read out, reset, or refreshed.

BRIEF DESCRIPTION OF THE DRAWINGS

The invention will be explained in more detail below by way of example with reference to drawing, in which.

The Figures are purely diagrammatic and not drawn to scale. Corresponding parts have been given the same reference numerals in general in the Figures.

DESCRIPTION OF THE PREFERRED EMBODIMENTS

Figure 1:
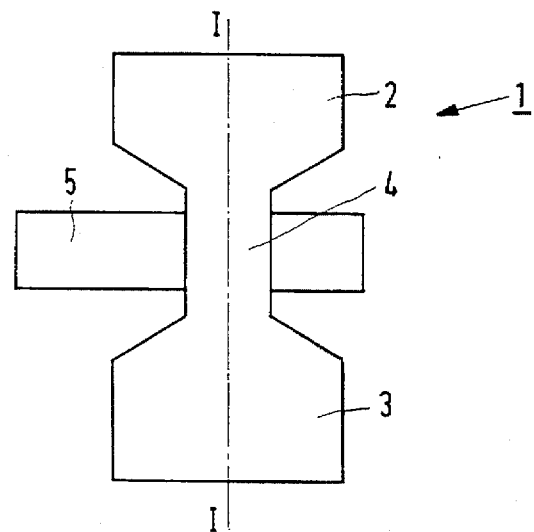
FIG. 1 is a plan view of the semiconductor device with a transparent switching element according to the invention.
Figure 2:
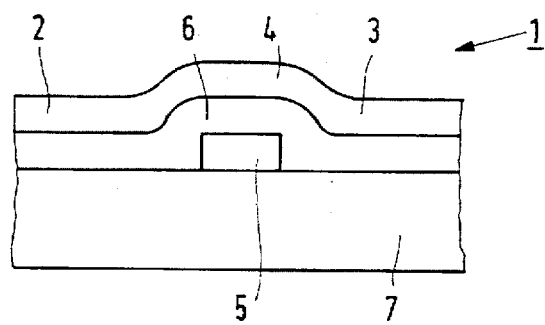
FIG. 2 is a cross-section taken on the line I—I of a semiconductor device of FIG. 1.
Figure 3:
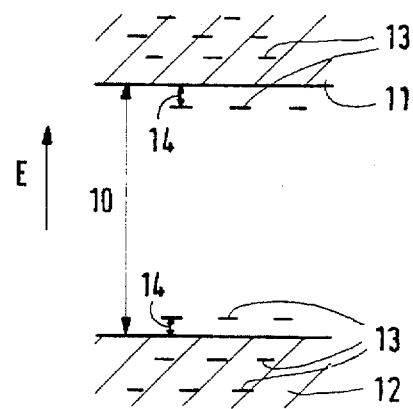
FIG. 3 shows the energy levels of electrons in a degenerate semiconductor according to the invention.

FIGS. 1 and 2 show a transparent semiconductor device with a switching element 1 having two connection electrodes 2, 3 of transparent material and an interposed transparent channel region 4 of a semiconductor material. In this example, the connection electrodes and the channel region are made from the same semiconductor material. The resistance in the connection electrodes 2, 3 is comparatively low only as a result of the width of the connection electrodes. The channel region 4 is provided with a transparent conductive gate electrode 5 which is separated from the channel region 4 by a transparent insulating layer 6. According to the invention, the semiconductor material of the channel region 4 comprises a degenerate semiconductor material with a basic material and dopant atoms. FIG. 3 shows the energy levels 13 of electrons in such a degenerate semiconductor. The basic material has a bandgap 10 between the conduction band 11 and valence band 12 of the electrons greater than 2.5 eV, the mobility of charge carriers of the basic material being greater than 10 cm$^2$/Vs. The basic material is provided with dopant atoms which form a fixed impurity energy level 13 adjacent or in the valence or conduction band 12, 11, as applicable, of the basic material. The impurity energy levels 13 lie adjacent the valence or conduction band 12, 11 at a distance 14 from the edge of the conduction or valence band of less than approximately 0.1 eV. The impurity energy levels 13 may be present within the entire valence or conduction band 12, 11. The conductivity is determined through a suitable choice of dopant atoms. A dopant atom concentration of between 0.001% and 0.3% supplies a sufficiently high conductivity. Electrons may be readily exchanged with the valence or conduction band 12, 11 from the impurity energy levels 13 at room temperature.

The semiconductor device of FIGS. 1 and 2 is manufactured as follows. A 50 nm thick conductive SrRuO$_3$ layer 5 is provided epitaxially on an insulating monocrystalline SrTiO$_3$ substrate 7. Although SrRuO$_3$ is in itself not transparent, a very thin layer of SrRuO$_3$ of less than approximately 60 nm is. A 0.7 µm thick molybdenum layer is vapor-deposited on this layer 5. The molybdenum layer is patterned in known manner by means of a photoresist and Ar-assisted reactive ion etching (RIE) with CF$_4$/O$_2$. The patterned molybdenum is then used as a mask for patterning the SrRuO$_3$ layer by means of RIE with CHF$_3$, so that the gate electrode 5 is formed. The remaining molybdenum is subsequently removed in a so-called redox etching treatment with potassium hexacyanoferrate. Then the transparent insulating layer 6 and the semiconductor material 4 are provided on the gate electrode 5 and on the surface of the substrate 7. In this example, a 0.2 µm thick insulating layer 6 of BaZrO$_2$ is provided by pulsed laser deposition at a temperature of 650° C. and an oxygen pressure of 0.2 mbar. Then a 0.1 µm thick layer 4 of In$_2$O$_3$ doped with 0.03% Sn is provided in known manner on the insulating layer 6 and on the surface of the substrate 7 by pulsed laser deposition at an oxygen pressure of 0.2 mbar and a temperature of 505° C. The layers 4 and 6 are patterned again with photoresist and a molybdenum layer, analogous to the conductive layer for the gate electrode 5. Etching takes place for a limited period only so as not to damage the gate electrode 5. The channel region 4 and the connection electrodes 2 and 3 are formed in this manner.

At a voltage of less than −4 V at the gate electrode 5 relative to the connection electrode 2, the channel region of a switching element manufactured in accordance with this first embodiment is fully depleted of charge carriers. A resistance above 200 kΩ then obtains between the connection electrodes 2 and 3. At a voltage above zero volts at the gate electrode 5, the switching element is conducting and the resistance between the connection electrodes 2 and 3 is approximately 10 kΩ.

The switching element according to the first embodiment may be varied in many ways. Thus the electrical properties of the switching element can be changed through changes in the geometry such as, for example, the dimensions of the channel region or the thickness of the insulating layer. It is also possible to use other covalent oxides of a non-transition metal provided with dopant atoms for the semiconductor material of the channel region 4. Oxides of these metals and mixtures of oxides of these metals have a mobility greater than 10 cm$^2$/Vs and a bandgap greater than 2.5 eV. For example, Ga$_2$O$_3$, Bi$_2$O$_3$, SnO$_2$, ZnO, Sb$_2$O$_3$ PbO, GeO$_2$, or In$_2$O$_3$, mixtures of these oxides or compounds formed from these oxides such as GaInO$_3$, ZnGa$_2$O$_4$, or CdGa$_2$O$_4$ may be used. The covalent oxides are provided by known techniques such as laser deposition, deposition after decomposition from the gas phase (CVD), or by vapor deposition. Dopant atoms may be introduced into the basic material through addition to the vapor deposition source or to the gases used. A concentration of dopant atoms of between 0.001% and 0.3% leads to a sufficiently high conductivity for use as a semiconductor material in a switching element.

Preferably, the semiconductor material comprises a covalent oxide of a metal from the group Sn, Zn, In. These covalent oxides have a comparatively high mobility of more than 30 cm$^2$/Vs even when provided with dopant atoms. The riopant atoms are attuned to the covalent oxides used. Thus riopant atoms such as Sb, F or Cl may be used when SnO$_2$ is the covalent oxide, Sn riopant atoms for In$_2$O$_3$, and Ga riopant atoms for ZnO. Especially Sb-doped SnO$_2$, also known as ATO, or Sn-doped In$_2$O$_3$, also known as ITO, are highly suitable materials.

Figure 4:
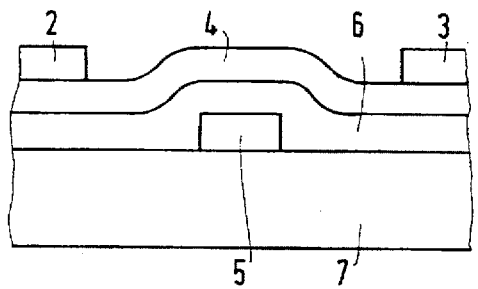
FIG. 4 is a cross-section of a second embodiment of the semiconductor device, FIG. 5 plots the resistance $R_{2-3}$ between connection electrodes 2 and 3 as a function of the voltage $V_{gate}$ between the gate electrode 5 and the connection electrode 2 in the second embodiment of the semiconductor device shown in FIG. 4, FIG. 6 plots the voltage $V_{gate}$ and the current $I_{2-3}$ between the connection electrodes 2 and 3 as a function of time t in the second embodiment of a semiconductor device as shown in FIG. 4, FIG. 7 plots the polarization P of the ferroelectric material as a function of the electric field across the ferroelectric material.

FIG. 4 shows a second embodiment of a switching element 1 according to the invention. A transparent conductive material is provided on a glass substrate 7, in this example a 0.2 µm thick SnO$_2$ layer doped with 1.5% Sb deposited in known manner by pulsed laser deposition at an O$_2$ pressure of 0.2 mbar and a temperature of 505° C. A 0.7 µm thick molybdenum layer is provided over the former layer by vapor deposition. This molybdenum layer is patterned in known manner by means of a photoresist and RIE with CF$_4$/O$_2$. The patterned molybdenum is then used as a mask for patterning the doped SnO$_2$ layer by means of RIE with CHF$_3$, so that the gate electrode 5 is formed. The molybdenum is subsequently removed in a redox etching treatment with potassium hexacyanoferrate. A 0.25 µm thick transparent insulating layer 6 of a ferroelectric material is then provided on the gate electrode 5 and on the surface of the substrate 7. Ferroelectric materials which may be used are, for example, lithium niobate (LiNbO$_3$), lithium tantalate (LiTaO$_3$) or lead-zirconium titanate (PbZr$_x$Ti$_{1-x}$O$_3$). In the present example, lead-zirconium titanate PbZr$_{0.2}$Ti$_{0.8}$O$_3$ is taken because this material can be provided comparatively easily without compatibility problems with the other materials used. In addition, said material has a comparatively high polarization (approximately 60 µC/cm$^2$) and a low electric switching field (approximately 50 kV/cm). The lead-zirconium titanate is provided in known manner by pulsed laser deposition at an oxygen pressure of 0.2 mbar and a temperature of 587° C.

Then a 0.1 µm thick layer 4 of SnO$_2$ doped with 0.03% Sb is provided in known manner on the ferroelectric layer 6 and on the surface of the substrate 7 by pulsed laser deposition at an O$_2$ pressure of 0.2 mbar and a temperature of 505° C. The layers 4 and 6 are patterned again by means of photoresist and a molybdenum layer, analogous to the conductive layer for the gate electrode 5. Etching takes place for a limited period only so as not to damage the gate electrode 5. Then the molybdenum layer is removed again. The channel region 4 is thus formed. A 0.5 µm thick conductive layer of SnO$_2$ doped with 1.5% Sb is subsequently provided over the surface. This layer is patterned by means of photoresist and a molybdenum layer for forming conductive connection electrodes 2 and 3 in a manner similar to that for the conductive layer for the gate electrode.

In this embodiment, the connection electrodes 2, 3, the gate electrode 5, and the channel region 4 comprise the same basic material provided with the same type of dopant atom, the semiconductor material of the connection electrodes 2, 3 and of the channel region 4 having a smaller quantity of dopant atoms than the conductive material of the gate electrode 5. Such a device can be manufactured in a comparatively simple manner because only one type of manufacturing process is necessary for these materials.

Figure 5:
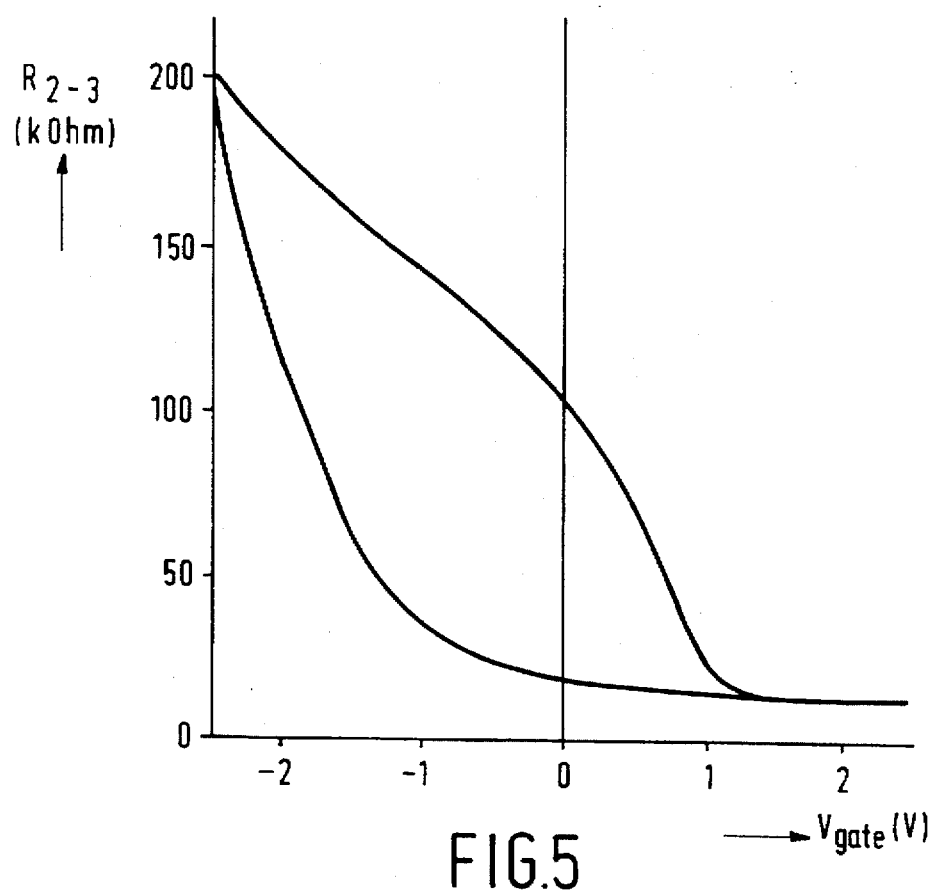

The switching behavior of the switching element according to this second embodiment is shown in FIG. 5. In this Figure, a resistance R$_{2-3}$ measured between the connection electrodes 2 and 3 is plotted on the vertical axis, and the voltage V$_{gate}$ at the gate electrode 5 relative to the electrode 2 on the horizontal axis. The resistance between the connection electrodes varies by a factor of approximately 5 in dependence on the polarization states of the ferroelectric insulating layer 6. The switching behavior of the switching element is asymmetrical, as is apparent from FIG. 5. This is probably related to the fact that a major portion of the voltage V$_{gate}$ is across the ferroelectric material 6 during periods of enhancement of the channel region (lower curve in FIG. 5), whereas in the case of depletion of the channel region (upper curve in FIG. 5) a substantial portion of the voltage V$_{gate}$ is across the depleted channel region 4. In other words, the effect of the voltage on the gate electrode is not the same in the case of depletion and of enhancement of the channel region because a portion of the voltage V$_{gate}$ is present across the channel region in the case of depletion, so that effectively a less negative voltage is seen. The switching element can be switched between the two states of the ferroelectric layer 6 in that a short voltage pulse is applied to the gate electrode 5. The resistance between the connection electrodes 2 and 3 assumes a value between the voltage pulses which corresponds to the remanent polarization of the ferroelectric material. The lower curve in FIG. 6 shows voltage pulses $V_{gate}$ at the gate electrode 5 of plus and minus 3 volts and a time duration of 100 μs.

Figure 6:
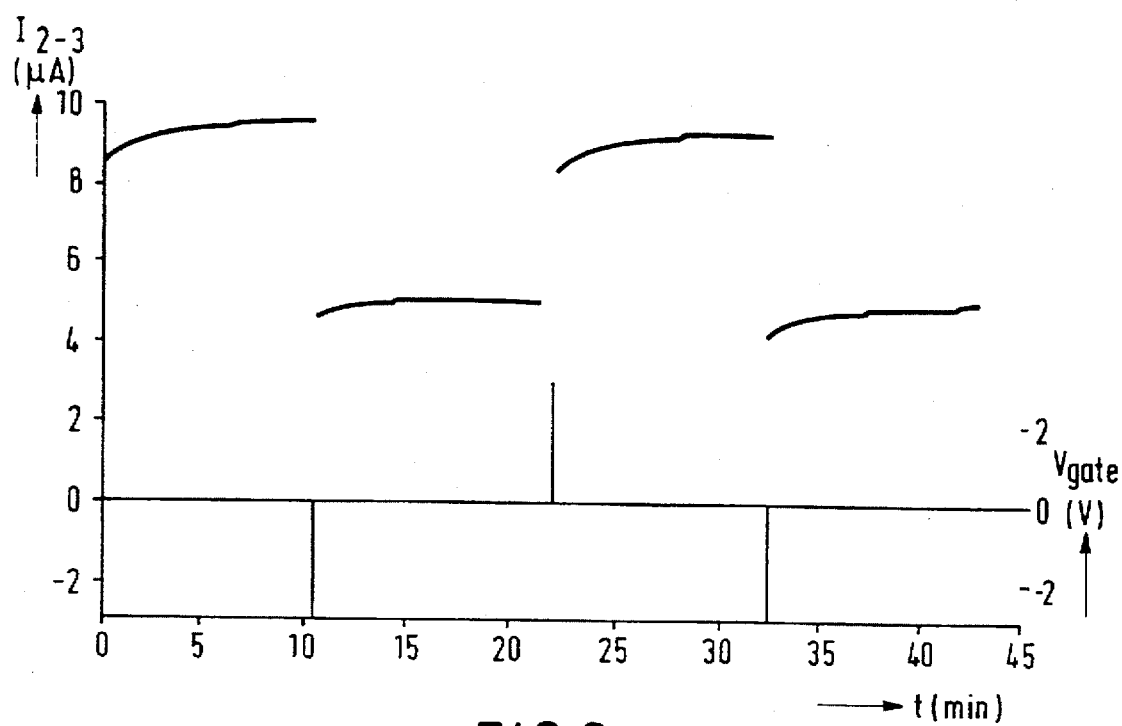

The upper curve in FIG. 6 shows the effect of these voltage pulses $V_{gate}$ on the current $I_{2-3}$ between the connection electrodes 2 and 3 as a function of time t. It is evident that the switching element 1 gives a different value for the current $I_{2-3}$ between the connection electrodes 2 and 3 in dependence on the value of the preceding switching pulse $V_{gate}$, i.e. in dependence on the direction of the remanent polarization.

Figure 7:
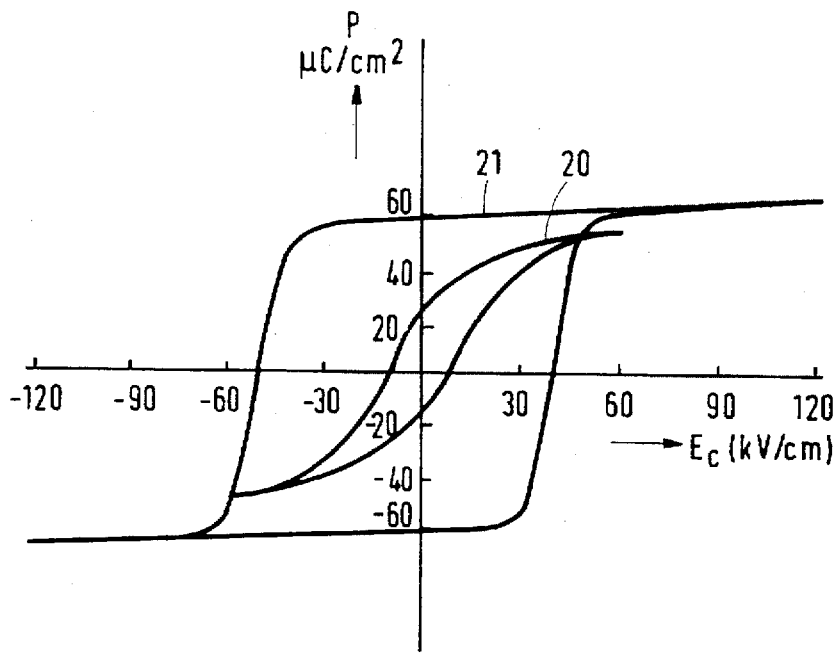

The switching properties of the switching element strongly depend on the kind of ferroelectric material and also on the specific composition of the ferroelectric material. Thus $PbZr_{0.5}Ti_{0.5}O_3$ has a dielectric constant ε of 1200, an electric switching field of 10 kV/cm, and a remanent polarization of 23 μC/cm². FIG. 7, curve 20, shows the polarization P as a function of the increase and decrease of the electric field $E_c$ across the ferroelectric material measured with a frequency of 1 kHz. $PbZr_{0.5}Ti_{0.5}O_3$, accordingly, shows comparatively little hysteresis. Another composition, $PbZr_{0.2}Ti_{0.8}O_3$, has a dielectric constant ε of 300, an electric switching field of 45 kV/cm, and a remanent polarization of 60 μC/cm², in which case a strong hysteresis occurs (FIG. 7, curve 21). A switching element in which a $PbZr_{0.5}Ti_{0.5}O_3$ layer 6 is used will thus show a gradual switching behavior (soft switching), wherein the remanent polarization will assume a value between the maximum remanent polarization possible and zero polarization when the switching element has not yet been fully switched. A switching element with such a ferroelectric material can retain as it were many switching states. The $PbZr_{0.2}Ti_{0.8}O_3$ very clearly has two switching states (discrete switching) because of the very strong hysteresis behavior of the ferroelectric material. A switching element with such a material will practically always be in one of the two switching states.

Figure 8:
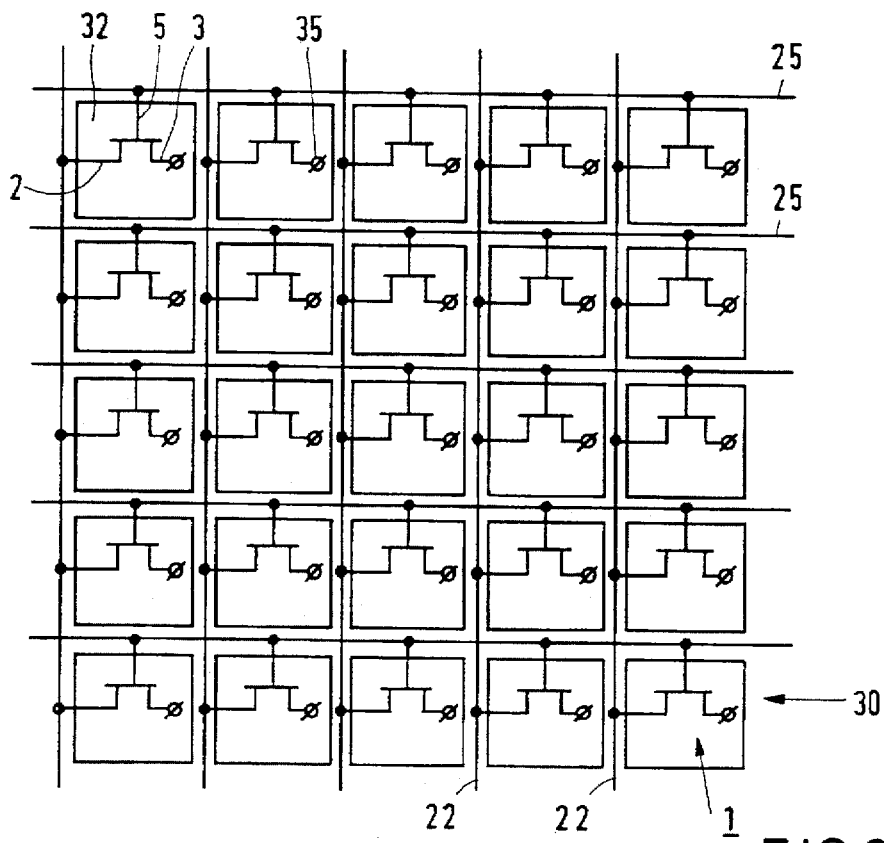
FIG. 8 is a plan view of a device in a third and fourth embodiment of the invention with electro-optical display or imaging elements with the accompanying switching elements in a matrix arrangement.
Figure 9:
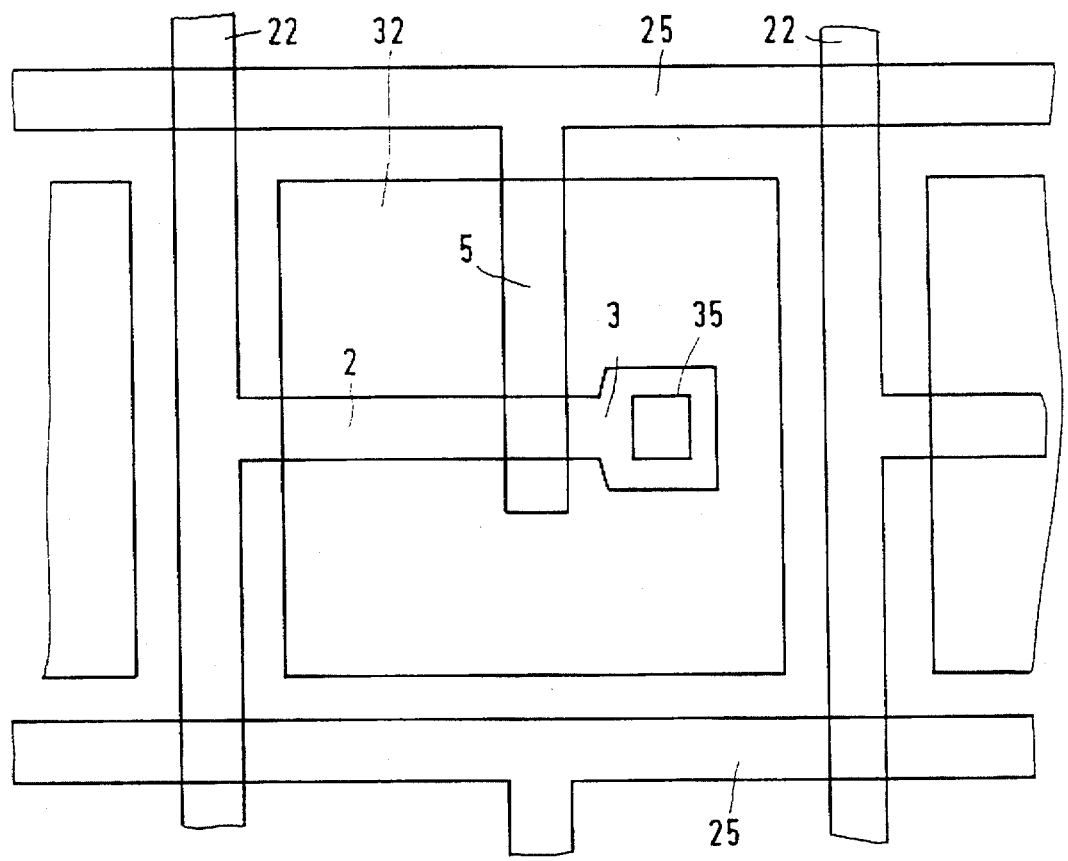
FIG. 9 is a plan view of a single display or imaging element with the accompanying switching element in the device of FIG. 9.
Figure 10:
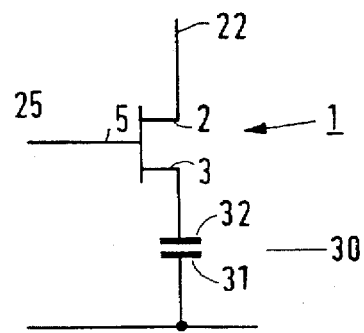
FIG. 10 is an equivalent circuit diagram of the semiconductor device of FIGS. 8 and 9, FIG. 11 plots an electric charge $Q_G$ per unit gate surface area displaced in the ferroelectric isolator as a function of the voltage $V_G$ at the gate electrode.

FIGS. 8, 9 and 10 show a third embodiment of the device comprising an electro-optical display element 30 and an accompanying switching element 1. The display element 30 acts a capacitor in known manner, being charged or discharged by the switching element 1 associated with the display element 30 (see FIG. 10). In this example, the device comprises a plurality of display and switching elements arranged in a matrix (see FIG. 8). The device is of a type called liquid crystal display (LCD). Each picture display element 30 comprises electrodes 31 and 32 and an electro-optical material situated between the electrodes. The optical properties of this electro-optical material change in dependence on the voltage applied across the electrodes 31 and 32. The element electrodes 31 and 32 are present on two different glass plates which are arranged parallel to one another with a small interspacing. The space between the glass plates is filled up with the electro-optical material. The one electrode 31 of the display element is a common electrode for all display elements, whereas the other electrode 32 is provided separately for each display element 30. Each display element 30 is controlled by its own switching element 1. For this purpose, the switching elements 1 are arranged on the same glass plate as the element electrodes 32, the connection electrodes 3 of the switching element 1 being connected to the electrodes 32 of the display elements 30. The other connection electrodes 2 of the switching elements 1 are connected to a bus line 22. The gate electrodes 5 of the switching elements are connected to a bus line 25. FIG. 10 shows an equivalent circuit diagram of the device. During operation, individual display elements 30 are controlled by means of signals on the bus lines 22 and 25. According to the invention, a transparent switching element 1 with a special transparent semiconductor material is used, the switching element 1 and the display element 30 overlapping one another at least in part. FIG. 9 is a plan view of a single picture display element 30 with the associated switching element 1. The construction of the switching element 1 of this embodiment is analogous to that of the switching element of the second embodiment. The only difference is that a 0.1 μm thick non-ferroelectric layer 6 of $Pb_{0.9}La_{0.1}Zr_{0.7}Ti_{0.3}O_3$ is provided by pulsed laser deposition instead of a ferroelectric layer 6. Such a non-ferroelectric layer 6 has a high dielectric constant ε so that an efficient depletion of the channel region 4 is possible. The gate electrode 5 in this example is patterned such that the gate electrode 5 is connected to the bus line 25. The gate electrode 5 is insulated from other conductors by the insulating layer 6. The connection electrode 2 is patterned such that it is connected to the bus line 22. A transparent insulating layer, in this example an $SiO_2$ layer provided by CVD, is deposited over the connection electrodes 2 and 3 of the switching element 1 in this example. This insulating layer insulates the connection electrode 2 from the element electrode 32 of the picture display element 32. A contact hole 35 is etched in known manner into the insulating layer. Then a transparent conductive layer, made of ITO in this example, is provided on the insulating layer and in the contact hole 35. This layer is patterned in known manner by means of a photoresist and a molybdenum layer, so that the element electrode 32 is formed. The element electrode 32 is connected to the connection electrode 3 of the switching element 1 via the contact hole 35. Then the glass plate with the element electrode 31 and the glass plate with the element electrodes 32 and the switching elements 1 are joined together in known manner and provided with the electro-optical material.

The device according to the invention is found to be sufficiently fast for display applications, i.e. the switching elements are capable of switching the display elements with a frequency of more than 100 Hz. The switching element and the display element overlap one another practically entirely in the semiconductor device according to the invention, so that a comparatively large portion of the surface area of the device can be used for picture display elements. A ferroelectric insulating layer 6 may alternatively be used in this third embodiment of the device. The switching elements 1 are capable then of retaining a state of a picture display element 30 without a voltage being applied to the gate electrodes 5.

In a fourth embodiment, the device comprises an electro-optical imaging element 30, while the transparent switching element 1 is connected to the imaging element 30 and at least a portion of the switching element and the imaging element overlap one another. FIGS. 8 and 9 also show such a device. The device is used as a component of an optical imaging apparatus such as camera or scanner. The electro-optical imaging element 30 is here understood to be an element which converts a flux of photons into a quantity which can be measured electrically. Thus it is possible, for example, to read out a charge, induced in the imaging element 30 by a photon, by means of the switching element 1. This fourth embodiment of the device is manufactured in that first an imaging element 30 is manufactured on a substrate by a standard method, for example, a so-called photodiode with a photosensitive pn junction which converts photons into charge carriers. The transparent switching element 1 is then provided on this imaging element 30 in a manner similar to that in the preceding embodiments. An electrical connection is subsequently laid between the connection electrode 3 of the switching element 1 and one side of the PN junction of the photodiode through a contact hole 35. The charge carriers generated in the imaging element by photons may then be read out by means of the switching element 1. Since the switching element 1 is transparent, it can overlap the imaging element 30. The camera may then be of a very compact construction, while a comparatively large portion of the surface area of the device can be used for the imaging elements 30, i.e. much surface area is available for collecting photons. In addition, each imaging element 30 can be read out separately.

Figure 11:
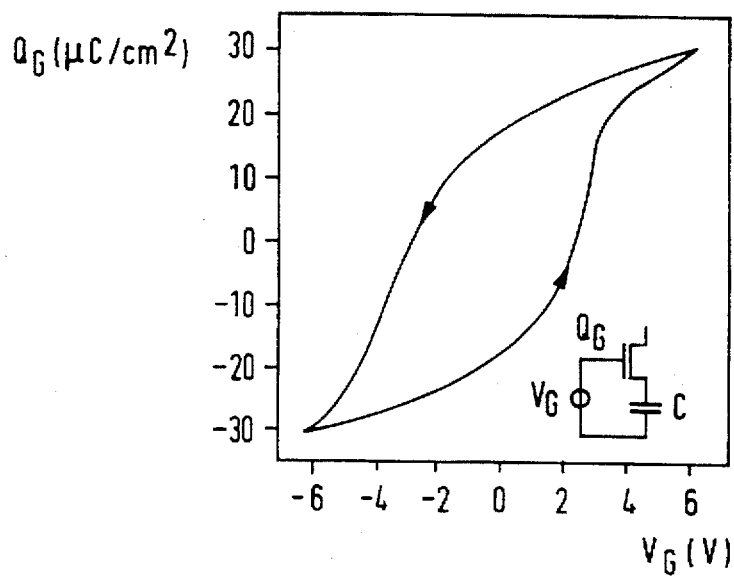
Figure 12:
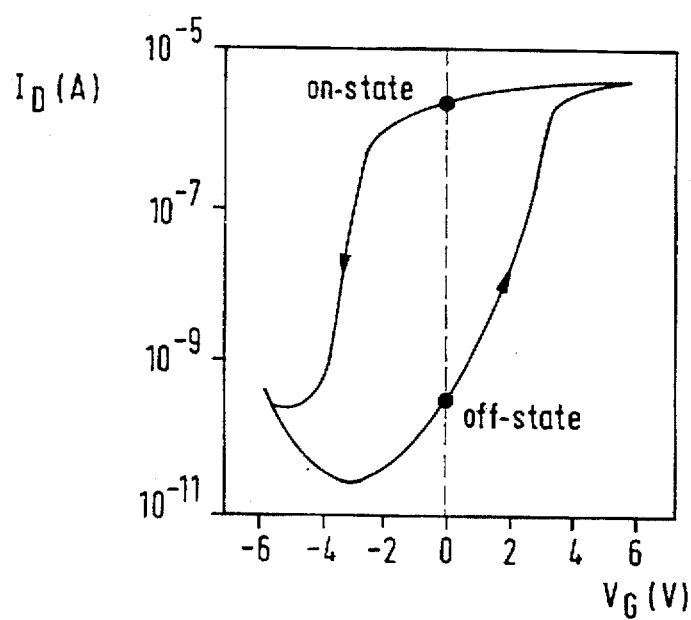
FIG. 12 is a transfer characteristic, i.e. a relation between the current $I_D$ between the connection electrodes and the voltage $V_G$ at the gate electrode.
Figure 13:
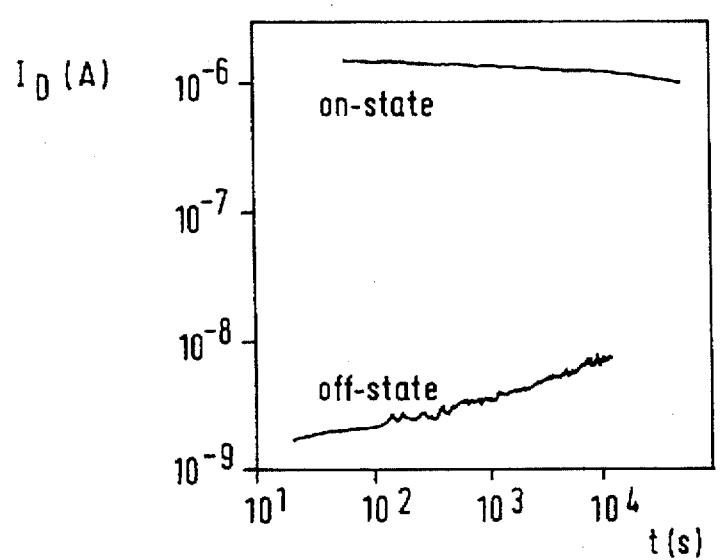
FIG. 13 shows a gradient of the current $I_D$ between the connection electrodes as a function of time t when a voltage pulse is applied to the gate electrode.
Figure 14:
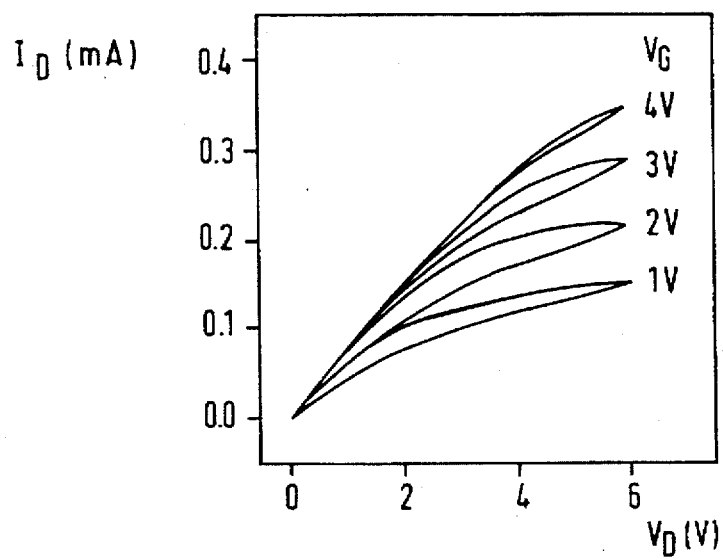
FIG. 14 is a current-voltage characteristic $I_D$ versus $V_G$ with $V_D$ and $V_G$ being varied.

In a fifth embodiment, a transistor is made in accordance with the second embodiment, but a different layer 4 is used for the channel region: a 10 nm thick layer of $SnO_2$ doped with 0.1% Sb. The transistor is covered with a capping layer of 10 nm $BaZrO_3$. FIGS. 11 to 14 show results obtained with this fifth embodiment of the transistor. FIG. 11 shows an electric charge $Q_G$ per unit gate surface area displaced in the ferroelectric isolator as a function of the voltage $V_G$ at the gate electrode. The displaced charge $Q_G$ was measured with an external capacitance C as sketched in FIG. 11. FIG. 12 shows a transfer characteristic, i.e. the relation between the current $I_D$ between the connection electrodes 2 and 3 and the voltage $V_G$ at the gate electrode. A voltage $V_D$ of 0.1 V is present between the connection electrodes here. The leakage current from the connection electrodes to the gate electrode disturbs the transfer characteristic at $V_G$ values below −3 V. FIG. 13 shows the gradient of the current $I_D$ between the connection electrodes 2 and 3 as a function of time t. $V_G$=0 V here, and $V_D$=0.1 V. At moment t=0, a pulsatory voltage $V_G$ was applied to the gate electrode with an amplitude of +6 V for the ON state and −6 V for the OFF state. FIG. 14 shows a current-voltage characteristic $I_D$ versus $V_G$. $V_D$ was varied for this from 0 V to 6 V and again to 0 V, while $V_G$ was varied in steps from 4 V to 1 V, as is also indicated in FIG. 14. FIGS. 11 to 14 clearly show that this fifth embodiment of the transistor has very good switching characteristics.

The invention is not limited to the embodiments described above. Thus certain covalent oxides of non-transition metals were chosen for the transparent semiconductor and conductor materials in the embodiments, but the devices may very well be manufactured with alternative covalent oxides of non-transition metals according to the invention. The resistance between the connection electrodes and the on/off ratio, i.e. the difference in resistance between the connection electrodes during switching or not switching of the switching element, may be adapted to specific requirements in that, for example, the type of semiconductor, insulating, or ferroelectric material is adapted, or the channel geometry, i.e. the width, length, and thickness of the channel region, is adapted. Thus an optimized material and an optimized geometry may be taken for each application as regards channel resistance, on/off ratio, and switching field of the ferroelectric material. It is also possible to make switching elements with different switching voltages from the ferroelectric material in that a different ferroelectric material is chosen, or a different layer thickness of the ferroelectric material. Furthermore, the materials of the device need not be transparent outside an imaging or display element. It is necessary for the switching elements to be transparent only in as far as the switching elements 1 and the imaging and display elements 30 overlap. It is accordingly very well possible, for example, for the bus lines 22 and 25 and part of the connection electrode 2 and of the gate electrode 5 to be provided with a metal layer in the third and fourth embodiments, for example, a molybdenum or aluminum layer for promoting conduction.

Certain techniques such as laser deposition, CVD, vapor deposition, and photolithography were suggested above for providing and patterning the material. This does not mean that the invention can be carried out only with such techniques. It will be obvious that alternative techniques such as epitaxial growing (MBE) or the provision of masking materials by a printing technique may very well be used.

What is claimed is:

1. A semiconductor device with a transparent switching element with two connection electrodes of transparent material and an interposed transparent channel region of a semiconductor material provided with a transparent gate electrode of conductive material separated from the channel region by a transparent insulating layer, characterized in that the semiconductor material comprises a degenerate semiconductor material with a basic material having a bandgap between the conduction and the valence bands of electrons greater than 2.5 eV and a mobility of charge carriers greater than 10 cm$^2$/Vs provided with dopant atoms which form a fixed impurity energy level adjacent or in the valence or conduction band of the basic material.

2. A semiconductor device as claimed in claim 1, characterized in that the basic material comprises a covalent oxide of a non-transition metal.

3. A semiconductor device as claimed in claim 2, characterized in that the basic material comprises a covalent oxide of a metal from the group Sn, Zn, and In.

4. A semiconductor device as claimed in claim 1, characterized in that the connection electrodes, the gate electrode, and the channel region comprise the same basic material provided with dopant atoms of the same type, while the semiconductor material contains a smaller quantity of dopant atoms than does the conductive material.

5. A semiconductor device as claimed in claim 4, characterized in that the conductive material contains more than 0.5% dopant atoms and the semiconductor material less than 0.3% dopant atoms.

6. A semiconductor device as claimed in claim 5, characterized in that the basic material comprises $SnO_2$ and the dopant atoms comprise Sb.

7. A semiconductor device as claimed in claim 1, characterized in that the insulating layer comprises a ferroelectric material.

8. A semiconductor device as claimed in claim 7, characterized in that the ferroelectric material comprises lead-zirconium titanate.

9. A semiconductor device as claimed in claim 1, characterized in that the device comprises an electro-optical display element with electrodes and an electro-optical material disposed between the electrodes, a connection electrode of the transparent switching element being connected to an electrode of the display element, while the switching element and the display element overlap one another at least partly.

10. A semiconductor device as claimed in claim 1, characterized in that the device comprises an electro-optical imaging element, the transparent switching element being connected to the imaging element, while the switching element and the imaging element overlap one another at least partly.

* * * * *